US010658580B2

(12) United States Patent
Campbell et al.

(10) Patent No.: US 10,658,580 B2
(45) Date of Patent: May 19, 2020

(54) SEMICONDUCTOR STRUCTURES INCLUDING MULTI-PORTION LINERS

(71) Applicant: Micron Technology, Inc., Boise, ID (US)

(72) Inventors: Kyle B. Campbell, Meridian, ID (US); Irina Vasilyeva, Boise, ID (US); Farrell M. Good, Meridian, ID (US); Vishwanath Bhat, Boise, ID (US); Kyuchul Chong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/857,873

(22) Filed: Dec. 29, 2017

(65) Prior Publication Data

US 2018/0123036 A1 May 3, 2018

Related U.S. Application Data

(62) Division of application No. 14/244,486, filed on Apr. 3, 2014, now Pat. No. 10,249,819.

(51) Int. Cl.
*H01L 45/00* (2006.01)
*H01L 27/24* (2006.01)
*H01L 21/768* (2006.01)

(52) U.S. Cl.
CPC ...... *H01L 45/1233* (2013.01); *H01L 27/2427* (2013.01); *H01L 45/06* (2013.01);
(Continued)

(58) Field of Classification Search
CPC ......... H01L 21/02126; H01L 21/76829; H01L 21/76834; H01L 21/76832; H01L 21/76835; H01L 23/5329; H01L 23/53295
See application file for complete search history.

(56) References Cited

U.S. PATENT DOCUMENTS 6,404,003 B1 6/2002 McMillan et al.
6,486,070 B1 11/2002 Ho et al.
(Continued)

FOREIGN PATENT DOCUMENTS

| KR | 1020040068024 | 7/2004 |
| KR | 1020080060321 | 7/2008 |
| KR | 1020100018445 | 2/2010 |

OTHER PUBLICATIONS

Gonzalez et al., Charge Trapping Analysis of Al2O3 Films Deposited by Atomic Layer Deposition Using H2O or O3 as Oxidant, J. Vacuum Sci. & Tech., vol. B 31, 01A101, 6 pages.
(Continued)

*Primary Examiner* — David C Spalla
(74) *Attorney, Agent, or Firm* — TraskBritt

(57) ABSTRACT

A method of forming a semiconductor structure. The method comprises forming a protective portion of a liner on at least a portion of stack structures on a substrate. The protective portion comprises a material formulated to adhere to the stack structures. A conformal portion of the liner is formed on the protective portion of the liner or on the protective portion of the liner and exposed materials of the stack structures. At least one of the protective portion and the conformal portion does not comprise aluminum. Additional methods of forming a semiconductor structure are disclosed, as are semiconductor structures including the liners comprising the protective portion and the conformal portion.

24 Claims, 5 Drawing Sheets

(52) U.S. Cl.
CPC .......... *H01L 45/12* (2013.01); *H01L 45/1675* (2013.01); *H01L 21/76832* (2013.01); *H01L 21/76834* (2013.01)

(56) References Cited

U.S. PATENT DOCUMENTS

| | | | |
|---|---|---|---|
| 7,215,564 | B2 | 5/2007 | Happ et al. |
| 7,482,616 | B2 | 1/2009 | Song |
| 7,491,600 | B2 | 2/2009 | Prinz et al. |
| 7,700,472 | B2 | 4/2010 | Kim |
| 7,741,638 | B2 | 6/2010 | Stewart et al. |
| 7,838,860 | B2 | 11/2010 | Happ et al. |
| 7,875,516 | B2 | 1/2011 | Knoefler et al. |
| 7,936,027 | B2 | 5/2011 | Xiao et al. |
| 8,129,705 | B2 | 3/2012 | Kinoshita et al. |
| 8,143,610 | B2 | 3/2012 | Park et al. |
| 8,153,527 | B2 | 4/2012 | Loh et al. |
| 8,203,134 | B2 | 6/2012 | Liu |
| 8,207,557 | B2 | 6/2012 | Sills et al. |
| 8,237,213 | B2 | 8/2012 | Liu |
| 8,394,683 | B2 | 3/2013 | Ramaswamy et al. |
| 8,450,714 | B2 | 5/2013 | Yasutake |
| 8,519,371 | B2 | 8/2013 | Fukumizu et al. |
| 8,536,015 | B2 | 9/2013 | Scheuerlein et al. |
| 8,822,968 | B2 | 9/2014 | Inokuma |
| 8,937,292 | B2 | 1/2015 | Bateman |
| 9,012,326 | B2 | 4/2015 | Kim et al. |
| 9,093,632 | B2 | 7/2015 | Tsubata |
| 9,136,307 | B2 | 9/2015 | Pellizzer |
| 9,224,615 | B2 | 12/2015 | Chang et al. |
| 9,406,877 | B2 | 8/2016 | Tada et al. |
| 9,748,311 | B2 | 8/2017 | Fantini et al. |
| 2003/0142944 | A1 | 7/2003 | Sundar et al. |
| 2004/0227227 | A1 | 11/2004 | Imanaka et al. |
| 2005/0167842 | A1 | 8/2005 | Nakamura et al. |
| 2005/0263829 | A1* | 12/2005 | Song ................ H01L 29/7843 257/379 |
| 2006/0056233 | A1 | 3/2006 | Parkinson et al. |
| 2006/0097240 | A1 | 5/2006 | Lowrey |
| 2007/0105306 | A1 | 5/2007 | Prinz et al. |
| 2007/0117256 | A1 | 5/2007 | Stewart et al. |
| 2007/0166980 | A1 | 7/2007 | Lee et al. |
| 2007/0275560 | A1 | 11/2007 | Nishimura et al. |
| 2008/0124917 | A1 | 5/2008 | Oh et al. |
| 2008/0293207 | A1 | 11/2008 | Koutny |
| 2008/0315359 | A1 | 12/2008 | Happ |
| 2009/0072274 | A1 | 3/2009 | Knoefler et al. |
| 2009/0231911 | A1* | 9/2009 | Liu .................... H01L 45/06 365/163 |
| 2009/0251944 | A1* | 10/2009 | Happ ................ G11C 11/5678 365/148 |
| 2009/0302362 | A1 | 12/2009 | Kikuchi et al. |
| 2010/0032637 | A1 | 2/2010 | Kinoshita et al. |
| 2010/0163818 | A1 | 7/2010 | Lee |
| 2010/0237502 | A1 | 9/2010 | Yu et al. |
| 2011/0068313 | A1 | 3/2011 | Liu |
| 2011/0244666 | A1 | 10/2011 | Kim et al. |
| 2011/0272664 | A1* | 11/2011 | Tada .................... H01L 27/228 257/4 |
| 2012/0001145 | A1* | 1/2012 | Magistretti ......... H01L 27/2445 257/4 |
| 2012/0040528 | A1 | 2/2012 | Kim et al. |
| 2012/0080792 | A1 | 4/2012 | Zhao |
| 2012/0098146 | A1 | 4/2012 | Lee |
| 2012/0181596 | A1 | 7/2012 | Liu |
| 2012/0220099 | A1 | 8/2012 | Dennison |
| 2012/0225534 | A1 | 9/2012 | Lee et al. |
| 2012/0235109 | A1 | 9/2012 | Nojiri |
| 2012/0236642 | A1 | 9/2012 | Lue |
| 2012/0313199 | A1 | 12/2012 | Orita et al. |
| 2012/0315384 | A1 | 12/2012 | Elhamid et al. |
| 2013/0016557 | A1 | 1/2013 | Kim |
| 2013/0043455 | A1 | 2/2013 | Bateman |
| 2013/0056698 | A1 | 3/2013 | Satoh |
| 2013/0137275 | A1 | 5/2013 | Tong et al. |
| 2013/0207068 | A1* | 8/2013 | Pellizzer ............. H01L 45/06 257/5 |
| 2013/0294152 | A1 | 11/2013 | Kau et al. |
| 2013/0333835 | A1 | 12/2013 | Garcia |
| 2014/0048795 | A1 | 2/2014 | Kim et al. |
| 2014/0170234 | A1 | 6/2014 | Van Epps et al. |
| 2014/0190565 | A1 | 7/2014 | Jung et al. |
| 2014/0273516 | A1 | 9/2014 | Xia et al. |
| 2014/0273524 | A1 | 9/2014 | Nguyen et al. |
| 2015/0041749 | A1 | 2/2015 | Liu et al. |
| 2015/0069473 | A1 | 3/2015 | Glass et al. |
| 2015/0069559 | A1 | 3/2015 | Tsubata et al. |
| 2015/0069581 | A1 | 3/2015 | Chang et al. |
| 2015/0137061 | A1 | 5/2015 | Donghi et al. |
| 2015/0179706 | A1* | 6/2015 | Rocklein ............. H01L 27/2481 257/4 |
| 2015/0243708 | A1 | 8/2015 | Ravasio |
| 2015/0287916 | A1 | 10/2015 | Campbell et al. |
| 2016/0056208 | A1 | 2/2016 | Pellizzer et al. |
| 2016/0133671 | A1 | 5/2016 | Fantini et al. |

OTHER PUBLICATIONS

Lee et al, Alucone Alloys with Tunable Properties Using Alucone Molecular Layer Deposition and A1203 Atomic Layer Deposition, J. Phys. Chem. C, vol. 116, (2012), pp. 3250-3257.

Lee et al., Growth and Properties of Hybrid Organic-Inorganic Metalcone Films Using Molecular Layer Deposition Techniques, Adv. Funct. Mater., vol. 23, (2013), pp. 532-546.

Miller et al., Thermo-Mechanical Poperties of Alumina Films Created Using the Atomic Layer Deposition Technique, Sensors and Actuators A: Physical, vol. 164 (2010), pp. 58-67.

Miller et al., Termomechanical Properties of Aluminum Alkoxide (Alucone) Films Created Using Molecular Layer Deposition, Acta Materialia, vol. 57 (2009), pp. 5083-5092.

Sniegowski et al., IC-Compatible Polysilicon Surface Micromachining, Annu. Rev. Mater. Sci. vol. 30, (2000), pp. 299-333.

Yoon et al, Molecular Layer Deposition of Hybrid Organic-Inorganic Alucone Polymer Films Using a Three-Step ABC Reaction Sequence, Chem. Mater. vol. 21, (2009), pp. 5365-5374.

Dameron et al., Molecular Layer Deposition of Alucone Polymer Films Using Trimethylaluminum and Ethylene Glycol, Chem. Mater., vol. 20, (2008), pp. 3315-3326.

International Search Report and Written Opinion for International Application No. PCT/US2015/015023, dated May 7, 2015, 16 pages.

Jen et al., Critical Tensile Strain and Water Vapor Transmission Rate for Nanolaminate Films Grown Using Al2O3 Atomic Layer Deposition and Alucone Molecular Layer Deposition, Applied Physics Letters, vol. 101, (2012), pp. 234103-1-234103-3.

Lai, Current Status of the Phase Change Memory and its Future, (2003) IEEE, 4 pages.

Lee et al., Characteristics of SiOC(-H) Thin Films Prepared by Using Plasma-Enhanced Atomic Layer Deposition, Journal of the Korean Physical Society, vol. 59, No. 5, Nov. 2011, pp. 3074-3079.

Liu et al. Fabrication of the Si2Sb2Te5 phase change cell structure for PCRAM by using UV nanoimprint lithography, Academy of Sciences, Shanghai, China, (2008) IEEE, pp. 807-810.

Ravasio, Marcello, U.S. Appl. No. 14/189,190 entitled, Cross-Point Memory and Methods for Fabrication of Same, filed Feb. 25, 2014.—US20140168490.

Sciarrillo, Samuele, U.S. Appl. No. 14/189,265 entitled, Cross-Point Memory and Methods for Fabrication of Same, filed Feb. 25, 2014.—Now US20150243885.

Seghete et al., Sacrificial Layers for Air Gaps in NEMS Using Alucone Molecular Layer Deposition, Sensors and Actuators A:Physical, (2009), doi: 10.1016/j.sna.2008.12.016, 8 pages.

Song et al., U.S. Appl. No. 14/189,323 entitled, Semiconductor Structures Including Liners Comprising Alucone and related Methods, filed Feb. 25, 2014.

* cited by examiner

SEMICONDUCTOR STRUCTURES INCLUDING MULTI-PORTION LINERS

CROSS-REFERENCE TO RELATED APPLICATIONS

This application is a continuation of U.S. patent application Ser. No. 14/244,486, filed Apr. 3, 2014, now U.S. Pat. No. 10,249,819, issued Apr. 2, 2019, the disclosure of which is hereby incorporated herein it its entirety by this reference.

This application is also related to U.S. patent application Ser. No. 14/189,323, filed Feb. 25, 2014, now U.S. Pat. No. 9,484,196, issued Nov. 1, 2016, and entitled SEMICONDUCTOR STRUCTURES INCLUDING LINERS COMPRISING ALUCONE AND RELATED METHODS, to U.S. patent application Ser. No. 14/189,265, filed Feb. 25, 2014, now U.S. Pat. No. 9,577,010, issued Feb. 21, 2017, and entitled CROSS-POINT MEMORY AND METHODS FOR FABRICATION OF SAME, and to U.S. patent application Ser. No. 14/189,490, filed Feb. 25, 2014, now U.S. Pat. No. 9,806,129, issued Oct. 31, 2017, and entitled CROSS-POINT MEMORY AND METHODS FOR FABRICATION OF SAME, the disclosure of each of which is hereby incorporated herein it its entirety by this reference.

FIELD

Embodiments disclosed herein relate to semiconductor structures including memory cells having liner materials and methods of forming such semiconductor structures. More specifically, embodiments disclosed herein relate to semiconductor structures for increasing memory density and methods of forming such semiconductor structures.

BACKGROUND

Due to rapid growth in use and application of digital information technology, there are demands to continuingly increase the memory density of memory devices while maintaining, if not reducing, the size of the devices. Three-dimensional (3D) structures have been investigated for increasing the memory density of a device. For example, 3D cross-point memory cells have been investigated as devices having increased capacity and smaller critical dimensions. These 3D semiconductor structures typically include stacks of materials on a substrate. The materials include phase change materials, switching diode elements, charge storage structures (e.g., floating gates, charge traps, tunneling dielectrics), and charge blocking materials between the charge storage structures and adjacent control gates.

Fabricating these 3D structures often requires forming high aspect ratio features from the stacks of materials. Frequently, materials that are sensitive to downstream processing conditions are present in the stacks. For example, stacks in 3D cross-point memory cells may include materials, such as chalcogenide materials, carbon-containing electrodes, and other sensitive materials, that may be damaged at the temperatures used during conventional semiconductor fabrication processes or may react with etchants used during downstream processing. For instance, chalcogenide materials in the stacks may volatilize during conventional deposition techniques, causing delamination of the stack materials. To protect the stacks, liners have been formed over the materials of the stack before the subsequent processing acts are conducted. In order to prevent damage to the materials of the stacks, a liner must be formed by a highly conformal deposition technique and must be formed using gentle deposition conditions. In addition, the liner must be formed of a high quality material. The liner must also adhere to the different materials of the stacks. Conventional liners, which are formed of a single material, such as silicon oxide or silicon nitride, do not meet these requirements because gentle deposition conditions and good adhesion are typically at odds with high quality and high conformality because deposition techniques that produce high quality, highly conformal materials damage chalcogenide materials of the stack and degrade adhesion. Conventional techniques for improving the step coverage and quality of the single material liners damage chalcogenide materials and degrade adhesion. Therefore, it would be desirable to produce a high quality, highly conformal liner that is formed under gentle deposition conditions and provides good adhesion to the underlying materials.

DETAILED DESCRIPTION

Figure 1A:
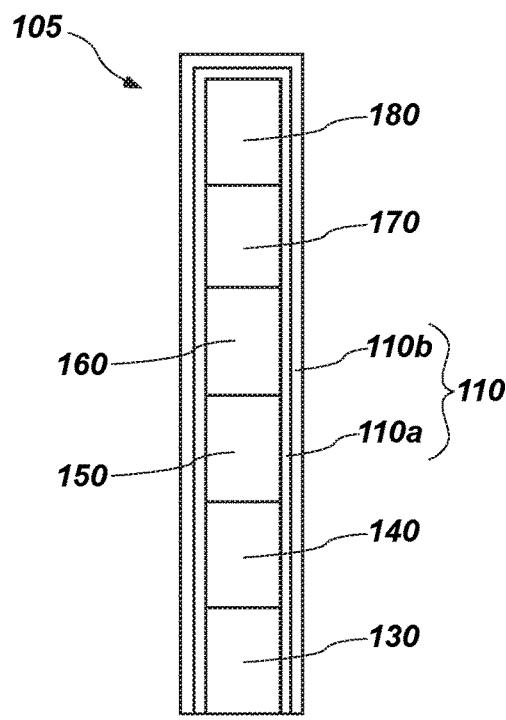
FIGS. 1A and 1B are simplified cross-sectional views of a liner according to some embodiments of the present disclosure on materials of a stack.

The illustrations included herewith are not meant to be actual views of any particular systems or memory structures, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing 3D semiconductor structures, and the semiconductor structures described below do not form a complete semiconductor device. Only those process acts and structures necessary to understand the embodiments described herein are described in detail below. Additional acts to form complete semiconductor devices including the semiconductor structures described herein may be performed by conventional techniques.

The present disclosure relates to a multi-portion liner, a portion of which is formulated to protect underlying materials of stacks on a substrate, while at least another portion of the liner is a highly conformal, high quality material. The liner includes at least two portions, the portion that protects and adheres to at least a portion of the stack, which is referred to herein as the protective portion or the protective material, and another portion that provides a high degree of conformality and quality to the liner, which is referred to herein as the conformal portion or conformal material. In addition to protecting the materials of the stacks from heat or chemical damage, the protective portion may be formulated to provide adhesion between the materials of the stacks and the conformal portion of the liner. The degree of protection provided by the protective portion of the liner may be sufficient to prevent intermixing or migration of chalcogenide materials from the stacks. The degree of adhesion provided by the protective portion of the liner may be sufficient for the conformal portion of the liner to adhere to the materials of the stacks. The conformal portion may be formed on the protective portion to provide good step coverage (e.g., conformality) and quality to the liner. As used herein, the term "step coverage" means and includes a ratio of a thickness of a material over a step edge to the thickness of the material on a flat surface. As used herein, the term "quality" means and includes the density, wet etch rate, and barrier property of the material. While embodiments of the liner are described and illustrated herein as having two portions, the liner may include more than two portions, the combination of which may achieve the desired adhesion, protective, step coverage, and film quality characteristics.

Figure 1B:
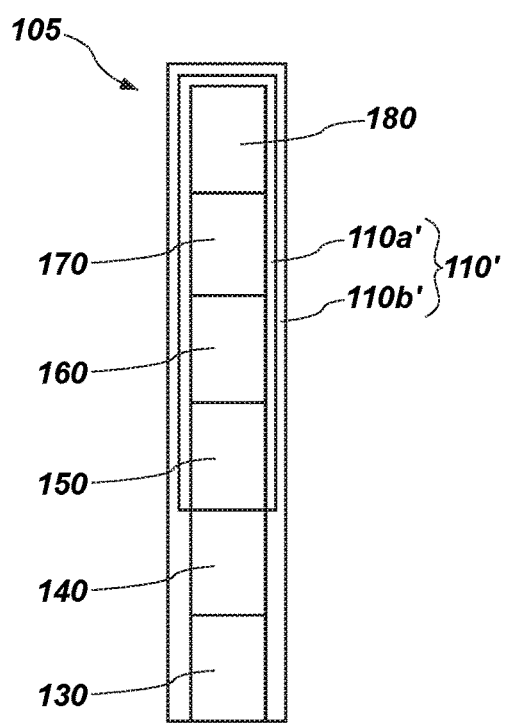

The liner may be a continuous film on the stacks or on a portion of the stacks, protecting the materials of the stacks from heat or chemical damage and functioning as a seal (e.g., an encapsulant) around the materials of the stacks. As used herein, the term "continuous" means and includes a material having substantially no interruptions, such as voids, gaps, pinholes, or other openings, therein, at least in regions where and/or for the processing acts during which it is intended to protect, seal, or encapsulate the materials of the stack. The liner may include the protective portion on (i.e., in direct contact with) the materials of the stacks, while the conformal portion is on (i.e., in direct contact with) the protective portion. The protective portion may be formed on at least a portion of the stacks such as on materials of the stacks that are heat sensitive or sensitive to chemical damage. In some embodiments, such as that of FIG. 1A, the protective portion 110a of the liner 110 is formed on substantially all the materials of the stacks 105, such that the protective portion 110a forms a continuous material on the stacks 105. The conformal portion 110b is then formed on the protective portion 110a. In other embodiments, as shown in FIG. 1B, the protective portion 110a' is formed on only a portion of the stacks 105, such as on sensitive materials of the stacks 105. In such situations, the protective portion 110a' of the liner 110' may be in direct contact with only certain materials of the stacks 105, such as materials sensitive to heat or chemical damage. The protective portion 110a' may form a continuous material on the desired portion of the stacks 105. The conformal portion 110b' is then formed over the protective portion 110a' and exposed regions of the stacks 105.

As explained in more detail below, the stacks 105 may include a conductive feature 130 on a substrate (not shown), a bottom electrode 140 on the conductive feature 130, a switching diode element 150 (e.g., a diode or an ovonic threshold switch) on the bottom electrode 140, a middle electrode 160 on the switching diode element 150, an active storage element 170 on the middle electrode 160, and a top electrode 180 on the active storage element 170. In some embodiments, only a subset of the features, elements, and/or electrodes may be present. The conductive feature 130 may be configured as a conductive line, such as an access line (e.g., a word line) or a digit line (e.g., a bit line). While a single stack is illustrated in FIGS. 1A and 1B, multiple stacks 105 may be present and separated from one another by openings (not shown). The stacks 105 may have an aspect ratio of up to about 15:1.

The protective portion 110a, 110a' and the conformal portion 110b, 110b' of the liner 110, 110' may be formed from at least one dielectric material, with the dielectric material of each portion selected to contribute different properties to the liner 110, 110'. The protective portion 110a, 110a' may provide protection of and adhesion to the underlying materials of the stacks 105, and the conformal portion 110b, 110b' may provide the desired degree of conformality and quality to the liner 110, 110'. Since the protective portion 110a, 110a' provides adhesion between the conformal portion 110b, 110b' and the materials of the stacks 105, the dielectric material of the protective portion 110a, 110a' may have a higher degree of adhesion to the materials of the stacks 105 than that of the conformal portion 110b, 110b'. Since the conformal portion 110b, 110b' provides the desired degree of conformality and quality to the liner 110, 110', the quality and conformality of the conformal portion 110b, 110b' may be higher than the quality and conformality of the protective portion 110a, 110a'.

The dielectric material of the protective portion 110a, 110a' may adhere to the materials of the stacks 105, such as to chalcogenide or carbon materials of the stacks 105. The protective portion 110a, 110a' of the liner 110, 110' may be formed by a technique that does not damage or degrade the materials of the stacks 105. The protective portion 110a, 110a' may be formed by a low temperature process, such as a process conducted at a temperature of less than about 250° C., reducing the likelihood of heat damage to the materials of the stacks 105. By way of example only, the protective portion 110a, 110a' may be formed by a low temperature, chemical vapor deposition (CVD) process, such as a capacitively coupled plasma enhanced chemical vapor deposition (PECVD) process, an inductively coupled plasma chemical vapor deposition (ICPCVD) process, a pulsed CVD process, or a remote plasma CVD process. The low temperature process for forming the protective portion 110a, 110a', if PECVD is employed, may be conducted with or without pulsing of the process power source.

In some embodiments, the protective portion 110a, 110a' is silicon nitride (SiN). As used herein, the term "silicon nitride" means and includes a chemical compound including silicon atoms and nitrogen atoms, and includes stoichiometric and non-stoichiometric compounds of silicon and nitrogen, as well as a gradient of nitrogen atoms in the silicon. The SiN is formed by a pulsed PECVD process conducted at a temperature of less than about 250° C. The PECVD process may utilize conventional silicon reactant gases that do not contain carbon and conventional nitrogen reactant gases. For instance, the SiN may be formed using silane ($SiH_4$) and ammonia ($NH_3$) or silane and nitrogen gas ($N_2$) as the reactant gases. Other parameters of the PECVD process, such as flow rates, pressure, and RF power may be determined by a person of ordinary skill in the art and are not described in detail herein. The PECVD process may also be free of chlorinated reagents or plasma treatments to reduce or prevent chemical damage or heat damage to the materials of the stacks 105.

In other embodiments, the protective portion 110a, 110a' of the liner 110, 110' is formed of aluminum oxide ($AlO_x$). The $AlO_x$ may be formed by conventional techniques, such as PECVD, which are not discussed in detail herein. By way of example only, the aluminum oxide may be formed by a low temperature atomic layer deposition process by pulsing aluminum precursors and oxygen containing precursors sequentially.

The protective portion 110a, 110a' may be formed at a thickness sufficient to protect the materials of the stacks 105 from heat or chemical damage. The protective portion 110a, 110a' may be formed to a desired thickness, such as from about 10 Å to about 30 Å or from about 15 Å to about 25 Å. Alternatively, the protective portion 110a, 110a' may be formed to a greater initial thickness and a portion of its thickness removed to produce the desired thickness of the protective portion 110a, 110a'. The protective portion 110a, 110a' may be formed on the stacks 105 at a single (i.e., substantially uniform) thickness, or the protective portion 110a, 110a' may vary in thickness depending on its location on the stacks 105. If, for example, the protective portion 110a' is formed on only a portion of the stacks 105 (see FIG. 1B), such as only on materials of the stacks 105 that are heat sensitive or sensitive to chemical damage, the thickness of the protective portion 110a' on a horizontal surface of the stacks 105 and upper sidewalls of the stacks 105 may be greater than the thickness on lower sidewalls of the stacks 105. By way of example only, the thickness of the protective portion 110a' on the horizontal surface and on the upper sidewalls of the stacks 105 may be about 25 Å and may gradually decrease to a thickness of about 0 Å along sidewalls of the bottoms of the stacks 105.

The conformal portion 110b, 110b' may be formed on the protective portion 110a, 110a' and any exposed portions of the materials of the stacks 105 as a continuous material, as shown in FIGS. 1A and 1B. Thus, the conformal portion 110b, 110b' may seal the materials of the stacks 105, providing low leakage and good electrical performance to memory cells including the stacks 105. The conformal portion 110b, 110b' may also be resistant to oxidation. The dielectric material of the conformal portion 110b, 110b' may be selected to provide good step coverage and quality to the liner 110, 110'. The dielectric material of the conformal portion 110b, 110b' may be formed of SiN, silicon oxynitride (SiON), silicon carbonitride (SiCN), silicon carboxynitride (SiOCN), or silicon dioxide ($SiO_2$). As used herein, the term "silicon oxynitride" means and includes a chemical compound including silicon atoms, nitrogen atoms, and oxygen atoms, and includes stoichiometric and non-stoichiometric compounds of silicon, nitrogen, and oxygen, as well as a gradient of nitrogen and oxygen atoms in the silicon. As used herein, the term "silicon carbonitride" means and includes a chemical compound including silicon atoms, carbon atoms, and nitrogen atoms, and includes stoichiometric and non-stoichiometric compounds of silicon, carbon, and nitrogen, as well as a gradient of nitrogen and carbon atoms in the silicon. As used herein, the term "silicon carboxynitride" means and includes a chemical compound including silicon atoms, carbon atoms, nitrogen atoms, and oxygen atoms, and includes stoichiometric and non-stoichiometric compounds of silicon, carbon, nitrogen, and oxygen, as well as a gradient of nitrogen, carbon, and oxygen atoms in the silicon.

In other embodiments, the dielectric material of the conformal portion 110b, 110b' may be formed of aluminum oxide ($AlO_x$). The aluminum oxide ($AlO_x$) as the conformal portion 110b, 110b' may be formed over a non-aluminum containing protective portion 110a, 110a'.

In yet other embodiments, the protective portion 110a, 110a' and the conformal portion 110b, 110b' may be formed of SiCN, where the SiCN of the protective portion 110a, 110a' includes a lower amount of carbon than the SiCN of the conformal portion 110b, 110b'.

Since any sensitive materials of the stacks 105 are protected by the protective portion 110a, 110a', formation of the conformal portion 110b, 110b' of the liner 110, 110' may utilize more aggressive chemistries or techniques than would be possible if the protective portion 110a, 110a' was not present, as described in more detail below. Formation of the conformal portion 110b, 110b' may also, optionally, include plasma or heat treatments, as described in more detail below, since any sensitive materials of the stacks 105 are protected by the protective portion 110a, 110a'. Thus, the conformal portion 110b, 110b' may be formed with fewer processing constraints than if the protective portion 110a, 110a' was not present.

The dielectric material of the conformal portion 110b, 110b' of the liner 110, 110' may be formed by a deposition technique that conformally forms the dielectric material on the protective portion 110a, 110a'. The dielectric material of the conformal portion 110b, 110b' may be formed by an atomic layer deposition (ALD) process that provides the desired conformality and quality, or an ALD-like process, such as pulsed CVD, remote plasma CVD, or PECVD. However, other processes may be used, such as a CVD process or a physical vapor deposition (PVD) process, with subsequent optional treatment acts conducted to improve the quality of the conformal portion 110b, 110b' and, thus, the quality of the liner 110, 110'. The precursors or reactant gases used to form the conformal portion 110b, 110b' may be selected by a person of ordinary skill in the art and, thus, are not described in detail herein. Other parameters of the process for forming the conformal portion 110b, 110b', such as flow rates, pressure, and RF power, may be determined by a person of ordinary skill in the art and are not described in detail herein.

The optional treatment of the conformal portion 110b, 110b' may include, but is not limited to, a plasma treatment, a heat treatment, or an ultraviolet (UV) treatment. The conformal portion 110b, 110b' of the liner 110, 110' may also, optionally, be modified or subjected to ex situ treatments to improve the quality of the liner 110, 110'. For instance, a total desired thickness of the conformal portion 110b, 110b' may be formed by the CVD process or PVD process and subjected to a plasma treatment, heat treatment, or UV treatment to increase the quality of the conformal portion 110b, 110b'. Alternatively, a desired thickness of the conformal portion 110b, 110b' may be formed by the CVD process or PVD process, and the resulting thickness subjected to the plasma treatment or heat treatment, followed by additional deposition and treatment acts until the conformal portion 110b, 110b' is of the total desired thickness. Thus, if the initial quality of an as-formed thickness of the conformal portion 110b, 110b' of the liner 110, 110' is not sufficient, the quality may be improved by subjecting the thickness of the conformal portion 110b, 110b' to the plasma treatment or heat treatment. The plasma treatment or heat treatment may densify the conformal portion 110b, 110b' of the liner 110, 110', improving its quality. The plasma treatment may include, but is not limited to, treatment with helium in a nitrogen ($N_2$) plasma or treatment with argon in a nitrogen ($N_2$) plasma. The plasma may be a direct plasma or a remote plasma and may be a capacitive-coupled plasma or an inductive-coupled plasma. The heat treatment may include, but is not limited to, subjecting the as-formed thickness of the conformal portion 110b, 110b' to an elevated temperature.

The conformal portion 110b, 110b' may be formed at a thickness sufficient to provide the desired conformality and quality to the liner 110, 110'. The conformal portion 110b, 110b' may be formed to a desired thickness, such as from about 20 Å to about 60 Å or from about 30 Å to about 50 Å. The conformal portion 110b, 110b' may have a single (i.e., substantially uniform) thickness. Thus, the liner 110, 110' may have a total thickness of from about 30 Å to about 100 Å, such as from about 30 Å to about 70 Å. In one embodiment, the conformal portion 110b, 110b' has a substantially constant thickness of about 40 Å.

Since the protective portion 110a, 110a' and the conformal portion 110b, 110b' may be formed by different techniques, the portions of the liner 110, 110' may be formed in different chambers. However, if the two portions of the liner 110, 110' are formed by similar techniques, the liner 110, 110' may be formed in a single chamber.

In one embodiment, the protective portion 110a, 110a' is formed of SiN by PECVD and the conformal portion 110b, 110b' is formed of SiN by ALD. The SiN of the protective portion 110a, 110a' may differ in composition (e.g., differing amounts of nitrogen) from the SiN of the conformal portion 110b, 110b' or both portions may have the same composition. While the liner 110, 110' includes both portions composed of SiN, the protective portion 110a, 110a' and the conformal portion 110b, 110b' may be visually distinguishable, such as by scanning electron microscopy (SEM) or tunneling electron microscopy (TEM). While both portions of the liner 110, 110' are formed of SiN, a more aggressive deposition technique may be used to form the conformal portion 110b, 110b' since the materials of the stacks 105 are covered by the protective portion 110a, 110a'. In addition, since the materials of the stacks 105 are covered by the protective portion 110a, 110a', the stacks 105 having the liner 110, 110' may spend a longer amount of time at a higher temperature, such as at a temperature of greater than about 250° C., during downstream processing.

In another embodiment, the protective portion 110a, 110a' is formed of SiN by PECVD and the conformal portion 110b, 110b' is formed of SiOCN by remote plasma CVD. In yet another embodiment, the protective portion 110a, 110a' is formed of SiN by PECVD and the conformal portion 110b, 110b' is formed of SiCN by direct plasma CVD. In still another embodiment, the protective portion 110a, 110a' is formed of SiN by PECVD and the conformal portion 110b, 110b' is formed of SiCN by remote plasma CVD.

The liner 110, 110' may be configured to include more than two portions, the combination of which may achieve the desired adhesion, protective, step coverage, and film quality characteristics. For instance, the liner 110, 110' may include a third portion (not shown) on the conformal portion 110b, 110b' or in between the protective portion 110a, 110a' and the conformal portion 110b, 110b'. By way of example only, the third portion may be formed from a dielectric material having higher thermal insulating properties than the materials of the protective portion 110a, 110a' and the conformal portion 110b, 110b'.

Figure 2A:
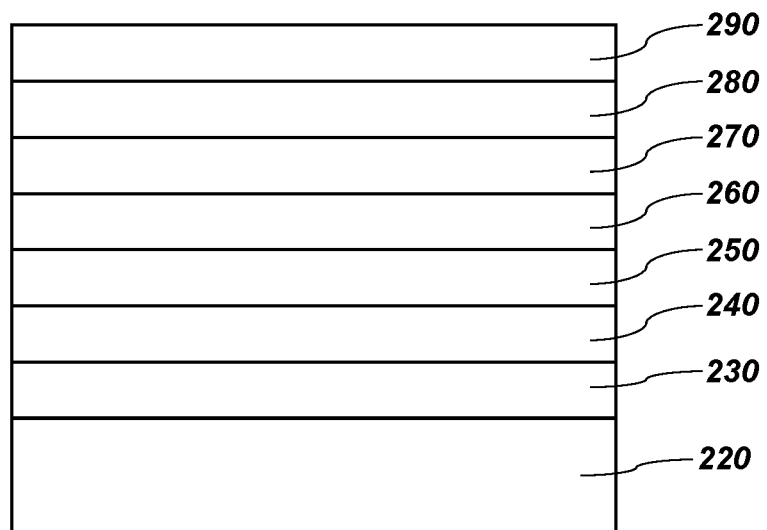
FIGS. 2A-FIG. 2G are simplified cross-sectional views of a 3D semiconductor structure at various stages of processing, the semiconductor structure including a liner according to some embodiments of the present disclosure.

A method of forming a 3D cross-point memory structure 200 (FIG. 2D) including a liner 210 on the stacks 205 is illustrated in FIGS. 2A to 2D. A conductive material 230, bottom electrode material 240, switching diode element material 250, middle electrode material 260, phase change material 270, top electrode material 280, and hard mask material 290 may be formed on a substrate 220, as shown in FIG. 2A. The materials may be formed on the substrate 220 by conventional techniques, which are not described in detail herein. The substrate 220 may be a base material or construction upon which additional materials are formed. The substrate 220 may be a semiconductor substrate, a base semiconductor layer on a supporting structure, a metal electrode or a semiconductor substrate having one or more layers, structures or regions formed thereon. The substrate 220 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 220 may be doped or undoped. The substrate 220 may include transistors and/or circuits such as, for example, decoding circuits of 3D cross-point memory cells.

The conductive material 230 may be formed on the substrate 220. The bottom electrode material 240 may be formed on the conductive material 230. The switching diode element material 250 may be formed on the bottom electrode material 240. The middle electrode material 260 may be formed on the switching diode element material 250. The phase change material 270 may be formed on the middle electrode 260. The top electrode material 280 may be formed on the phase change material 270 and a hard mask material 290 may be formed on the top electrode material 280. The hard mask material 290 may be formed of a nitride material, such as silicon nitride. These materials may be formed by conventional techniques, which are not described in detail herein.

The conductive material 230 may be a conductive material including, but not limited to, tungsten, aluminum, copper, nickel, strontium, hafnium, zirconium, titanium, tantalum, platinum, alloys thereof, heavily doped semiconductor material, a conductive silicide, a conductive nitride, a conductive carbide, or combinations thereof. In some embodiments, the conductive material 230 is tungsten.

The bottom electrode material 240, the middle electrode material 260, and the top electrode material 280 may be formed from the same or different materials. The electrode materials 240, 260, 280 may be formed from a conductive or semiconductive material, such as tungsten, platinum, palladium, tantalum, nickel, titanium nitride (TiN), tantalum nitride (TaN), tungsten nitride (WN), polysilicon, a metal silicide, or a carbon material. In some embodiments, the bottom electrode material 240, middle electrode material 260, and the top electrode material 280 are formed from a carbon material.

Each of the switching diode element material 250 and the phase change material 270 may be formed from a chalcogenide material, such as a chalcogenide-metal ion glass, a chalcogenide glass, or other materials. The chalcogenide material may include sulfur, selenium, tellurium, germanium, antimony, or combinations thereof. The chalcogenide material may be doped or undoped or may have metal ions mixed therein. By way of non-limiting example, the chalcogenide material may be an alloy including indium, selenium, tellurium, antimony, arsenic, bismuth, germanium, oxygen, tin, or combinations thereof. The switching diode element material 250 and the phase change material 270 may include chalcogenide materials having the same composition or different compositions. In some embodiments, the switching diode element material 250 and the phase change material 270 comprise different chalcogenide materials.

Figure 2B:
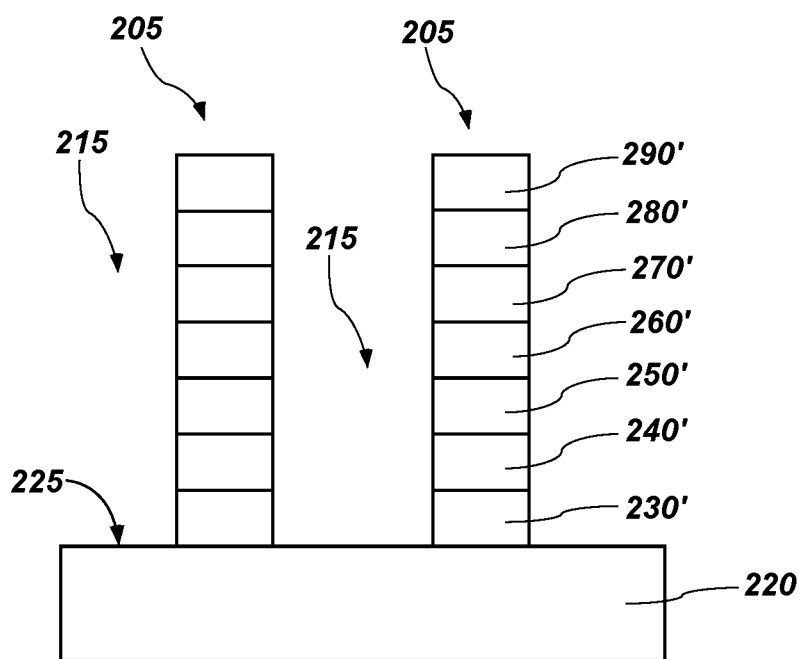
Figure 2C:
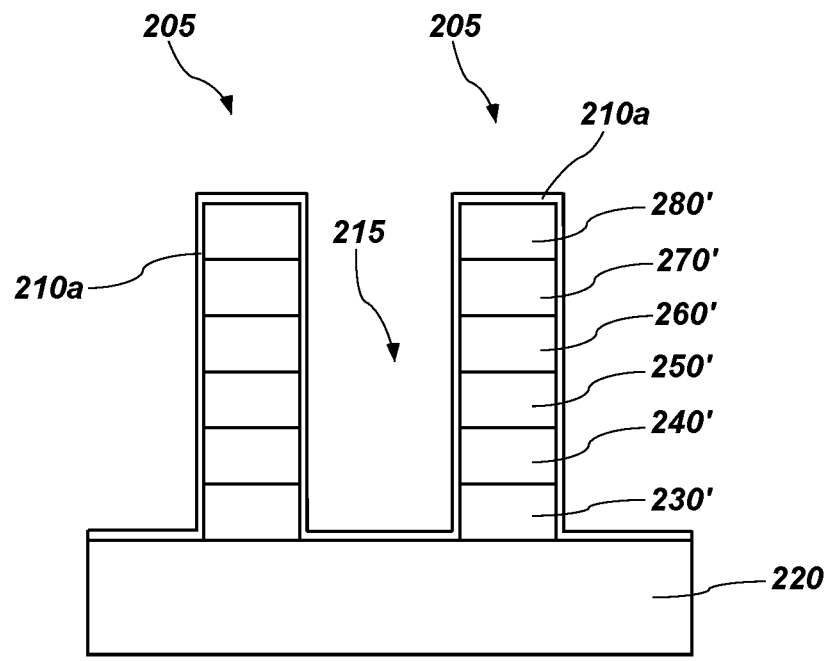
Figure 2D:
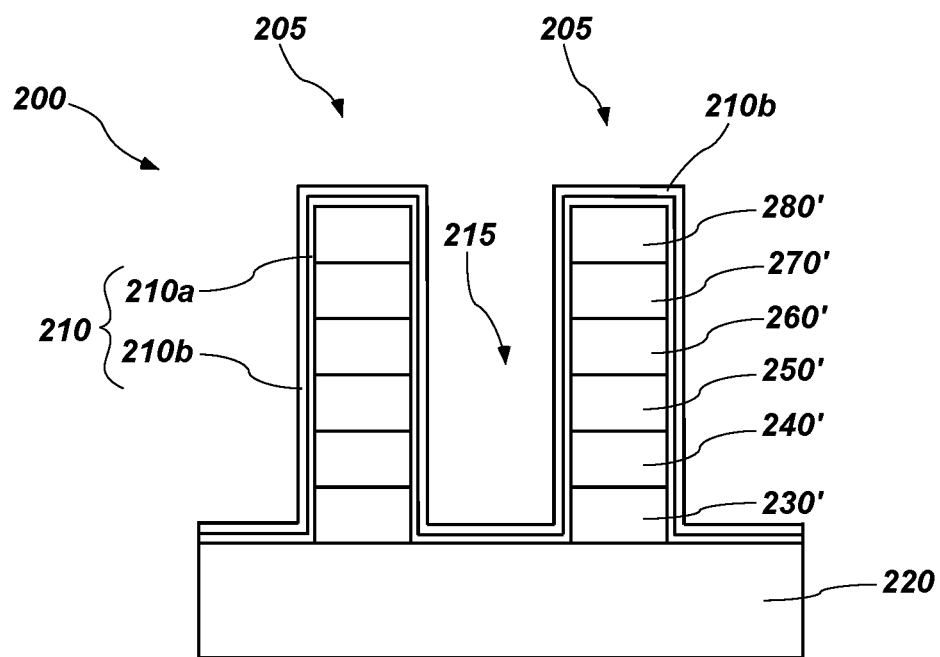

Openings 215 may be formed in the materials overlying the substrate 220 to expose a top surface 225 of the substrate 220, as shown in FIG. 2B. The openings 215 may be formed by conventional techniques, such as by removing portions of the underlying materials using the hard mask material 290 as a mask. The hard mask material 290 may be patterned, and the pattern transferred into the underlying materials using conventional photolithography techniques, which are not described in detail herein. The materials exposed through the patterned hard mask 290' may be removed by conventional removal techniques, which are not described in detail herein. Each of the materials may be removed separately or a single etchant may be used to simultaneously remove one or more of the materials. The patterned hard mask 290' may be removed, forming stacks 205. The stacks 205 include conductive feature 230' on the substrate 220, bottom electrode 240' on the conductive feature 230', switching diode element 250' on the bottom electrode 240', middle electrode 260' on the switching diode element 250', active storage element 270' on the middle electrode 260', and top electrode 280' on the active storage element 270', which correspond to the conductive feature 130, bottom electrode 140, switching diode element 150 (e.g., a diode or an ovonic threshold switch), middle electrode 160, active storage element 170, and top electrode 180, respectively, in FIGS. 1A and 1B. As shown in FIG. 2C, the protective portion 210a of the liner 210 may be formed on the stacks 205 by a low temperature process, as described above. The protective portion 210a of the liner 210 may be formed on sidewalls of the conductive feature 230', bottom electrode 240', switching diode element 250', middle electrode 260', active storage element 270', and top electrode 280', and on a top horizontal surface of the top electrode 280', as well as on the top surface 225 of the substrate 220. As shown in FIG. 2D, the conformal portion 210b of the liner 210 may then be formed on the protective portion 210a by a process as described above. The optional treatments described above to improve the quality of the liner 110, 110' may be conducted after completion of the liner 210 or during formation of the liner 210.

If the liner 110, 110' includes a third portion (not shown), the third portion may be formed by similar techniques to those described above for the protective portion 110a, 110a' and the conformal portion 110b, 110b'. The third portion may be formed on the conformal portion 110b, 110b' or inbetween the protective portion 110a, 110a' and the conformal portion 110b, 110b'.

Accordingly, a method of forming a semiconductor structure is disclosed. The method comprises forming a protective portion of a liner on at least a portion of stack structures on a substrate. The protective portion comprises a material formulated to adhere to the stack structures. A conformal portion of the liner is formed on the protective portion or on the protective portion and exposed materials of the stack structures. At least one of the protective portion and the conformal portion does not comprise aluminum.

Another method of forming a semiconductor structure is also disclosed. The method comprises forming a protective portion of a liner on stack structures on a substrate. The protective portion comprises silicon nitride or aluminum oxide. A conformal portion of the liner is formed on the protective portion. The conformal portion comprises a material selected from the group consisting of silicon nitride, silicon oxynitride, silicon carbonitride, silicon carboxynitride, and silicon dioxide.

Figure 2E:
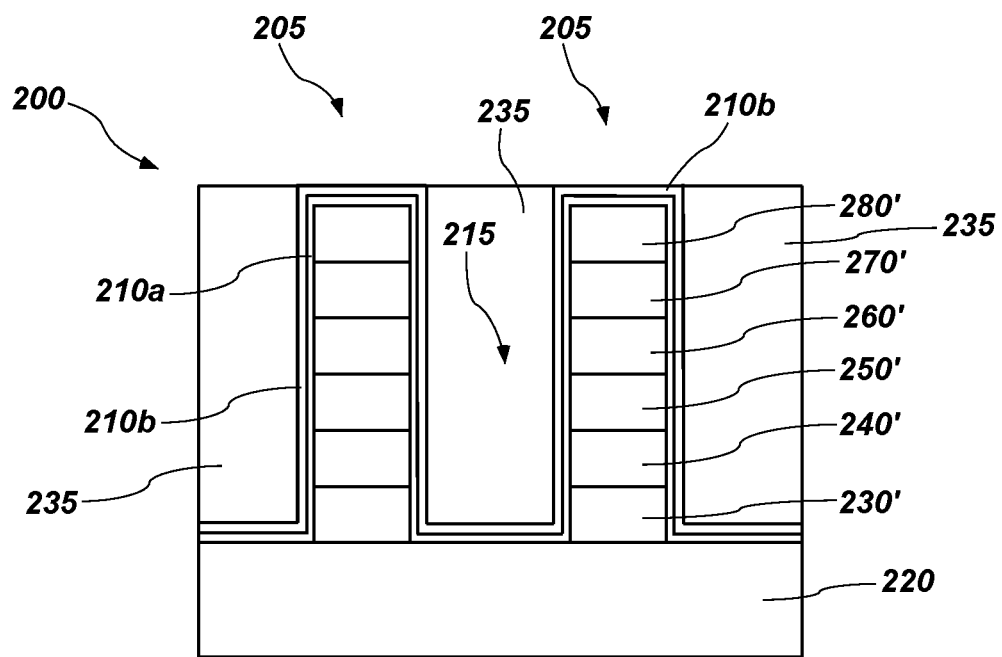

The openings 215 between adjacent stacks 205 may be filled with a dielectric material 235, such as a silicon dioxide material, as shown in FIG. 2E. Additional process acts may then be conducted to form a complete 3D cross-point memory structure from the structure 200 in FIGS. 2D and 2E. The additional process acts may be formed by conventional techniques, which are not described in detail herein.

Figure 2F:
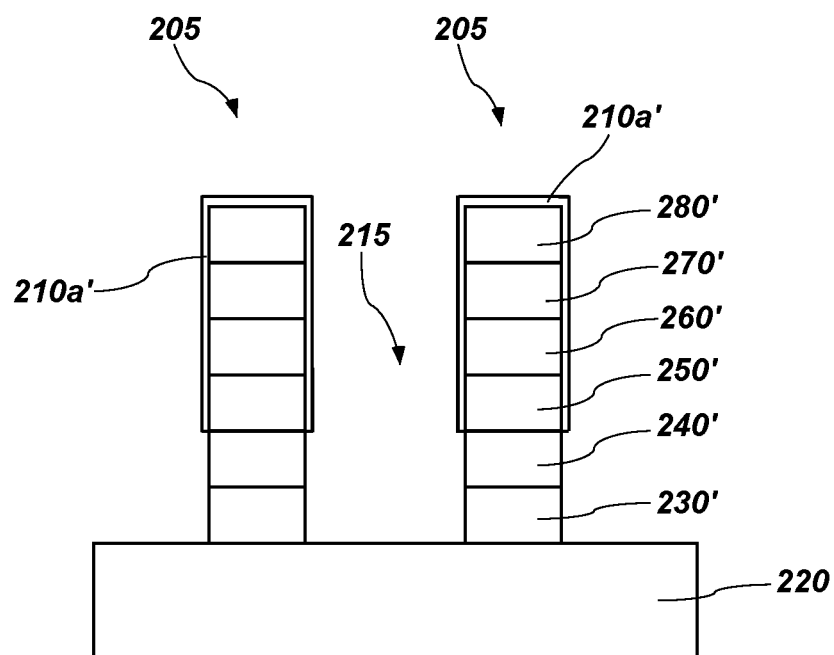
Figure 2G:
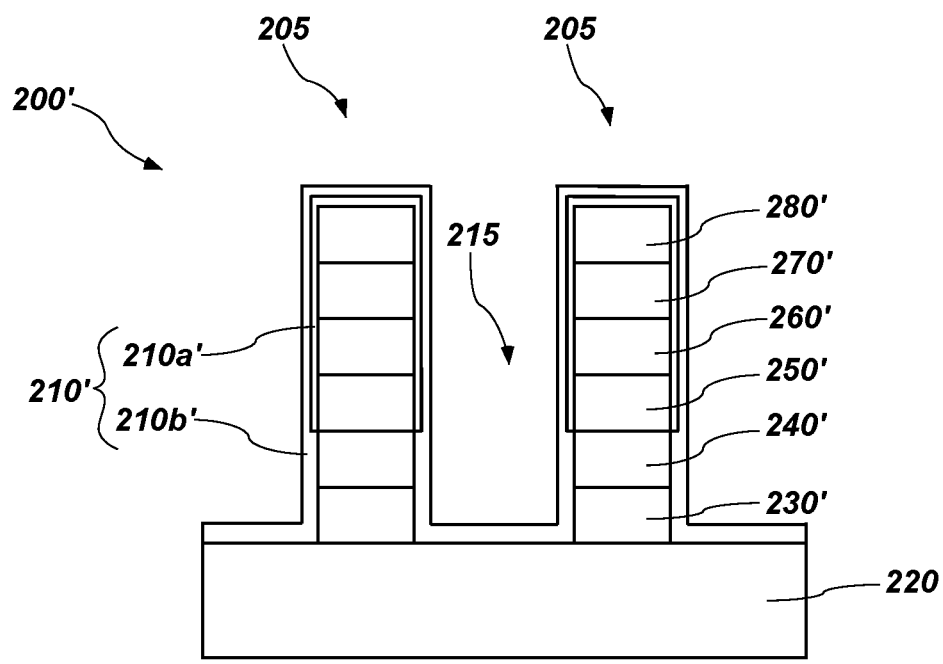

Another method of forming a 3D cross-point memory structure 200' including the liner 210' on the stacks 205 is illustrated in FIGS. 2F and 2G. Rather than forming the protective portion 210a of the liner 210 on the entire stacks 205 as shown in FIG. 2C, the protective portion 210a' may be formed only on materials that are sensitive to heat or chemical damage, such as on the chalcogenide or carbon materials. By way of example only, the protective portion 210a' of the liner 210' may be formed on sidewalls of the switching diode element 250', middle electrode 260', active storage element 270', and top electrode 280', and on a top horizontal surface of the top electrode 280', as shown in FIG. 2F. The conformal portion 210b' of the liner 210' may then be formed on the protective portion 210a', and on sidewalls of the conductive feature 230', bottom electrode 240', switching diode element 250', middle electrode 260', active storage element 270', and top electrode 280', and on the top horizontal surface of the top electrode 280', as well as on the top surface 225 of the substrate 220, as shown in FIG. 2F. The optional treatments described above to improve the quality of the liner 110, 110' may be conducted after completion of the liner 210' or during formation of the liner 210'.

The openings 215 between adjacent stacks 205 may be filled with the dielectric material 235, such as a silicon dioxide material, as described above in reference to FIG. 2E. Additional process acts may then be conducted to form a complete 3D cross-point memory structure from the structures in FIG. 2G. The additional process acts may be formed by conventional techniques, which are not described in detail herein.

While the liner 110, 110', 210, 210' is described and illustrated herein as being used in cross-point memory structures 200, 200', the liner 110, 110', 210, 210' according to embodiments of the present disclosure may be used in other semiconductor structures where sensitive materials, such as chalcogenide or carbon materials, are present in high aspect ratio features and need protection from downstream processing acts.

The liner according to some embodiments of the present disclosure may exhibit improved step coverage compared to that of a single material liner (an oxide liner) formed by PECVD. The step coverage of a liner including SiN formed by PECVD as the protective portion and SiN formed by ALD as the conformal portion was measured by conventional techniques, which are not described in detail herein. It was determined that the liner exhibited about 80% step coverage (e.g., conformality) compared to the single material liner (the oxide liner) formed by PECVD, which exhibited about 30% step coverage. Without being bound by any theory, the improved step coverage of the liner according to some embodiments of the present disclosure is believed to be due to the high step coverage provided by the conformal portion of the liner.

Accordingly, disclosed is a semiconductor structure comprising stack structures and a liner comprising a protective portion and a conformal portion on at least a portion of the stack structures. The stack structures comprise carbon materials and chalcogenide materials on a substrate. The liner exhibits about 80% step coverage.

The liner according to some embodiments of the present disclosure also exhibited improved adhesion to carbon materials compared to that of a single material liner formed from an oxide or a carbon-containing nitride. The liner included SiN formed by PECVD as the protective portion and SiN formed by ALD as the conformal portion. The adhesion was measured by a blanket PVD carbon tape test, a 4-point bend interfacial fracture energy test, SEM structural verification, and/or TEM structural verification. These tests are known in the art and, therefore, are not described in detail herein. The liner exhibited an interfacial fracture energy of greater than or equal to about 3 J/m², such as greater than or equal to about 20 J/m² for adhesion between the PVD carbon and the liner. With the single material liner, delamination from the carbon materials of the electrodes was observed, which resulted in diffusion and migration of the chalcogenide materials. The single material liner, which was formed from an oxide or a carbon-containing nitride, exhibited an interfacial fracture energy of less than 2.8 J/m² for adhesion between the PVD carbon and the oxide.

Accordingly, disclosed is a semiconductor structure comprising stack structures and a liner comprising a protective portion and a conformal portion on at least a portion of the stack structures. The stack structures comprise electrode materials and chalcogenide materials on a substrate. The liner exhibits an interfacial fracture energy of greater than or equal to about 3 J/m² between the protective portion of the liner and the stack structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor structure, comprising:
   stack structures comprising electrode materials and chalcogenide materials on a substrate; and
   a liner on at least a portion of the stack structures, the liner comprising a protective portion and a conformal portion directly contacting the protective portion and comprising a different material than the protective portion, the protective portion comprising aluminum oxide, silicon carbonitride, or silicon carboxynitride, the conformal portion comprising silicon carbonitride or silicon carboxynitride, the liner exhibiting an interfacial fracture energy of greater than or equal to about 3 J/m² between the protective portion of the liner and the stack structures, and the liners of adjacent stack structures separated by a dielectric material.

2. The semiconductor structure of claim 1, wherein the protective portion of the liner comprises a thickness from about 10 Å to about 30 Å.

3. The semiconductor structure of claim 1, wherein the conformal portion of the liner comprises a thickness from about 20 Å to about 60 Å.

4. The semiconductor structure of claim 1, wherein each of the stack structures comprises a conductive material on the substrate, a bottom electrode material on the conductive material, a phase change material on the bottom electrode material, a middle electrode material on the phase change material, another phase change material on the middle electrode material, and a top electrode material on the another phase change material.

5. The semiconductor structure of claim 1, wherein the protective portion does not comprise aluminum.

6. The semiconductor structure of claim 1, wherein the protective portion of the liner is substantially only on the electrode materials and the chalcogenide materials of the stack structures.

7. The semiconductor structure of claim 1, wherein the conformal portion of the liner comprises silicon carboxynitride and the protective portion of the liner comprises silicon carboxynitride.

8. The semiconductor structure of claim 7, wherein the silicon carboxynitride of the protective portion comprises a lower amount of carbon than the silicon carboxynitride of the conformal portion.

9. The semiconductor structure of claim 1, wherein the conformal portion of the liner comprises silicon carbonitride and the protective portion of the liner comprises silicon carbonitride.

10. The semiconductor structure of claim 9, wherein the silicon carbonitride of the protective portion comprises a lower amount of carbon than the silicon carbonitride of the conformal portion.

11. The semiconductor structure of claim 1, wherein the liner exhibits an interfacial fracture energy of greater than or equal to about 20 J/m².

12. The semiconductor structure of claim 1, wherein the protective portion of the liner is on thermally sensitive materials of the stack structures.

13. The semiconductor structure of claim 1, wherein a thickness of the protective portion decreases from an upper portion of the stack structures to a lower portion of the stack structures.

14. A semiconductor structure, comprising:
    stack structures comprising electrode materials and chalcogenide materials on a substrate;
    a liner on at least a portion of the stack structures, the liner comprising a protective portion and a conformal portion directly contacting the protective portion and comprising a different material than the protective portion, the protective portion comprising silicon nitride, aluminum oxide, or silicon carbonitride, the conformal portion comprising silicon nitride, silicon oxynitride, silicon carbonitride, or silicon carboxynitride, the liner exhibiting an interfacial fracture energy of greater than or equal to about 3 J/m² between the protective portion of the liner and the stack structures, and the liners of adjacent stack structures separated by a dielectric material; and
    an additional portion of the liner on the conformal portion of the liner, the additional portion having a higher thermal insulating property than the protective portion and the conformal portion.

15. A semiconductor structure, comprising:
    stack structures comprising carbon materials and chalcogenide materials on a substrate; and
    a liner comprising a protective portion and a conformal portion on at least a portion of the stack structures, the liner exhibiting about 80% step coverage, wherein the conformal portion has a greater thickness adjacent to portions of the stack structures other than the carbon materials and chalcogenide materials than a thickness adjacent to the carbon materials and chalcogenide materials.

16. The semiconductor structure of claim 15, wherein the protective portion comprises silicon nitride in contact with the carbon materials and chalcogenide materials of the stack structures and the conformal portion comprises silicon nitride, silicon oxynitride, silicon carbonitride, or silicon carboxynitride in contact with the protective portion.

17. The semiconductor structure of claim 15, wherein the conformal portion of the liner comprises a material selected from the group consisting of silicon nitride or silicon oxynitride.

18. The semiconductor structure of claim 15, wherein the conformal portion of the liner comprises silicon carbonitride or silicon carboxynitride in contact with the protective portion of the liner.

19. The semiconductor structure of claim 15, wherein the protective portion of the liner is substantially only on the carbon materials and the chalcogenide materials of the stack structures.

20. The semiconductor structure of claim 15, wherein the chalcogenide materials comprise a switching diode element material or a phase change material.

21. A semiconductor structure, comprising:
stack structures comprising electrode materials and chalcogenide materials on a substrate; and
a liner on at least a portion of the stack structures, the liner comprising a protective portion and a conformal portion directly contacting the protective portion and comprising a different material than the protective portion, the protective portion of the liner comprising aluminum oxide ($AlO_x$), the conformal portion comprising silicon nitride, silicon oxynitride, silicon carbonitride, or silicon carboxynitride, the liner exhibiting an interfacial fracture energy of greater than or equal to about 3 $J/m^2$ between the protective portion of the liner and the stack structures, the liners of adjacent stack structures separated by a dielectric material, and the stack structures comprising carbon materials and the chalcogenide materials.

22. A three-dimensional cross-point memory structure, comprising:
stack structures comprising carbon materials and chalcogenide materials on a substrate; and
a liner comprising a protective portion comprising silicon carbonitride and a conformal portion comprising silicon carbonitride, the silicon carbonitride of the protective portion having a lower amount of carbon than the silicon carbonitride of the conformal portion, the protective portion on at least a portion of the stack structures and the conformal portion on the protective portion.

23. The three-dimensional cross-point memory structure of claim 22, wherein the stack structures comprise a bottom electrode on a conductive feature on the substrate, a switching diode element on the bottom electrode, a middle electrode on the switching diode element, an active storage element on the middle electrode, and a top electrode on the active storage element.

24. The three-dimensional cross-point memory structure of claim 22, wherein the protective portion of the liner is on substantially all of the materials of the stack structures.

* * * * *